United States Patent
Chin et al.

[11] Patent Number: 5,613,087
[45] Date of Patent: Mar. 18, 1997

[54] CACHE TESTING USING A MODIFIED SNOOP CYCLE COMMAND

[75] Inventors: Henry Chin, Wappingers Falls; George Totolos, Jr., Poughkeepsie, both of N.Y.

[73] Assignee: International Business Machines Corporation, Armonk, N.Y.

[21] Appl. No.: 392,644

[22] Filed: Feb. 23, 1995

[51] Int. Cl.$^6$ ...................................................... G06F 12/02
[52] U.S. Cl. ............................................ 395/481; 395/445
[58] Field of Search ................................. 395/471, 416, 395/417, 418, 421.11, 483, 465, 445, 462, 481

[56] References Cited

U.S. PATENT DOCUMENTS

| | | |
|---|---|---|
| 4,774,049 | 5/1988 | Kuban et al. . |
| 4,887,203 | 12/1989 | MacGregor et al. . |
| 4,907,189 | 3/1990 | Branson et al. . |
| 4,912,630 | 3/1990 | Cochcroft . |
| 4,945,512 | 7/1990 | DeKarske et al. . |
| 4,996,641 | 2/1991 | Talgam et al. . |
| 5,165,029 | 11/1992 | Sawai et al. . |
| 5,195,096 | 3/1993 | Moore . |
| 5,226,150 | 7/1993 | Callander et al. . |
| 5,237,671 | 8/1993 | Freitas et al. . |
| 5,249,281 | 9/1993 | Fuccio et al. . |
| 5,287,481 | 2/1994 | Lin ............................................ 395/462 |
| 5,423,019 | 6/1995 | Lin ............................................ 395/462 |

OTHER PUBLICATIONS

IBM Technical Disclosure Bulletin No. 9B, vol. 36, pp. 197–198, Sep. 1993, entitled "Cache Tag RAM Diagnostic Mode" by Ferrarini et al.

IBM Technical Disclosure Bulletin No. 5A, vol. 32, pp. 126–128, Oct. 1989 entitled "Intel 82385 Snoop Diagnostic Circuit to Test DMA/BUS Master Snoop Cycles" by Begun et al.

Primary Examiner—Tod R. Swann
Assistant Examiner—Christopher S. Chow
Attorney, Agent, or Firm—Marc A. Ehrlich

[57] ABSTRACT

The cache controller of a second level cache in an Intel Pentium processor based computer system contains test circuitry that allows reading and writing directly into all tag RAM databit locations. This circuitry responds to a modified External Address Strobe (EADS#) command to invoke the tag test cycle. The EADS# command is normally used in a SNOOP read cycle by the system. In a SNOOP cycle, the main memory controller invokes the EADS# command to request the first level ($L_1$) and second level ($L_2$) caches for modified information stored in those caches. In the tag test cycle the EADS# command line is held down twice as long as it would in a normal SNOOP read Cycle. Because of its added length, the SNOOP cycle circuits in the $L_2$ cache ignore the command on the EADS# command line. However, the tag RAM test circuitry in the $L_2$ cache recognizes the extended EADS# strobe providing a path to access all bit locations in a tag RAM for both read and write cycles to test the tag RAM or to load those bit positions to selected states in testing other portions of the cache.

18 Claims, 5 Drawing Sheets

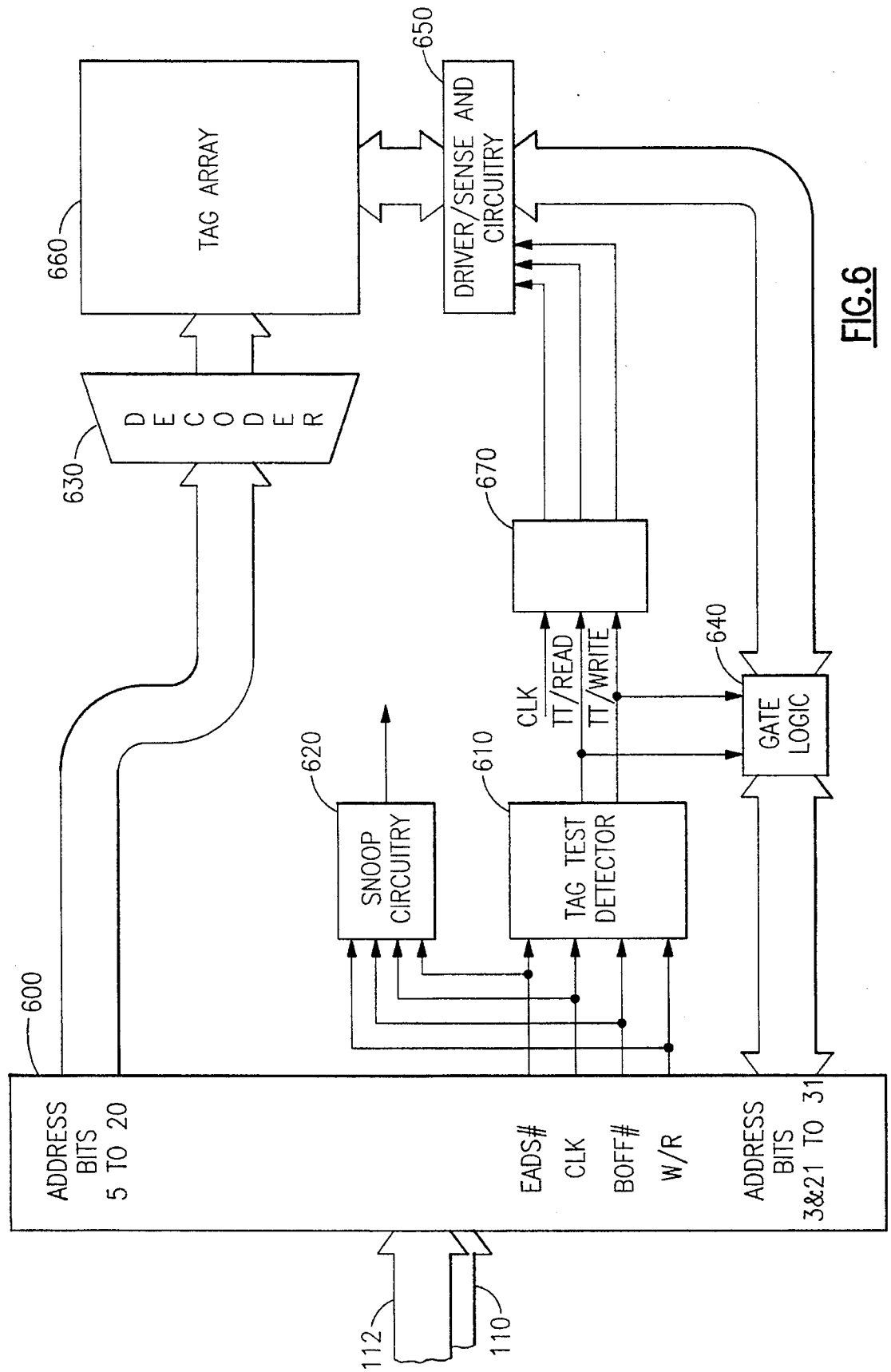

CACHE TESTING USING A MODIFIED SNOOP CYCLE COMMAND

FIELD OF INVENTION

The present invention relates to cache stores and more particularly to testing such stores.

BACKGROUND OF THE INVENTION

Some data processing systems, such as those based on the Intel Pentium microprocessor chip, have portions that are not accessible to testing using normal commands of the system. Such a cache can be logically divided into three separate entities: a data random access memory (data RAM) for storing system data and instructions; a tag RAM for storing status data about the information stored in the data RAM; and control circuitry for overall operation of the cache. A test fixture for this cache must be able to fully test all circuit elements in all three of these entities in order to be sure of their quality and operability. The present invention is concerned with testing of the tag RAM independently of the other entities of the cache. The behavior of the cache is completely dependent of the status data stored in the tag RAM. If the bit locations in the tag RAM containing those status bits are defective, the cache will react in ways that are difficult to debug. In addition to testing the tag RAM for its independent operability, it is desirable to be able to enter data into it to test the cache and the system for their overall operability. However, while the storage locations in the data RAM are accessible and easy to test, the storage locations in the tag RAM, including those storing status data, are not readily accessible. All bits in a tag RAM word go to the cache controller and not onto the microprocessor system bus. Therefore, it is difficult to determine when an error occurs if an error is in the tag RAM or in the cache controller. Furthermore, certain data bit patterns do not occur in the tag RAM during normal system operation. For these reasons it is difficult to test the bit positions of the tag RAM themselves and to enter test patterns to test overall cache operation.

BRIEF DESCRIPTION OF THE INVENTION

In accordance with the present invention a standard system instruction is modified and control circuits in the cache are provided which respond to this modified command to provide accessibility to the tag RAM through a data path which is independent of the cache controller. In the preferred embodiment of this invention, the cache controller of a second level cache in an Intel Pentium processor based computer system contains test circuitry that allows the system or a test fixture to read and write directly into all tag RAM databit locations. This circuitry responds to a modified External Address Strobe (EADS#) command to invoke the tag test cycle. The EADS# command is normally used in a SNOOP read cycle by the system. In a SNOOP cycle, the main memory controller invokes the EADS# command to request the first level ($L_1$) and second level ($L_2$) caches for modified information stored in those caches. In the tag test cycle the EADS# command line is held down twice as long as it would in a normal SNOOP read Cycle. Because of its added length, the SNOOP cycle circuitry in the $L_2$ cache ignores the command on the EADS# command line. However, the tag RAM test circuitry in the $L_2$ cache recognizes the extended EADS# strobe providing a path to access all bit locations in a tag RAM for both read and write cycles to test the tag RAM or to load those bit positions to selected states in testing other portions of the cache.

Therefore, it is an object of the present invention to test normally inaccessible portions of a cache.

It is another object of the invention to use a modified system command to invoke an altered cache instruction that provides an operating state for use in testing.

DESCRIPTION OF THE DRAWINGS

The foregoing and other objects, features and advantages of the present invention will be apparent from the following description of a preferred embodiment of the invention as illustrated in the accompanying drawings of which:

FIG. 6 is a block diagram of the test circuitry in the $L_2$ cache.

DETAILED DESCRIPTION

Figure 1:
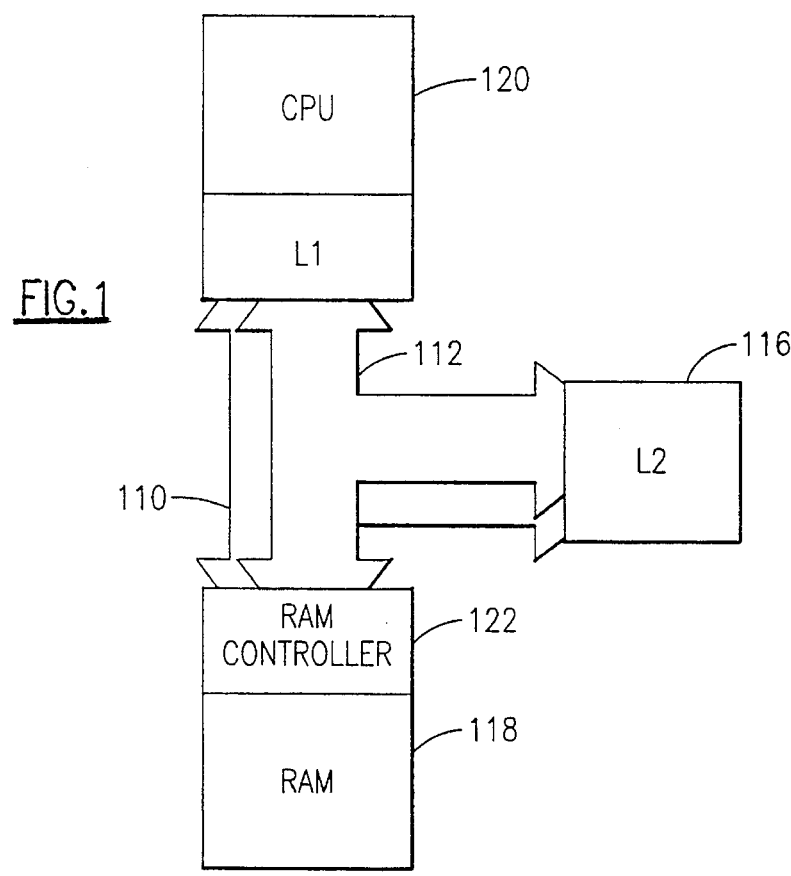
FIG. 1 is a block diagram of main memory and the $L_1$ and $L_2$ caches linked together by data and address buses.

Referring now to FIG. 1, a data bus 110 and an address and control line buss 112 are shown linking the $L_2$ cache 116, to the $L_1$ cache 114, and the RAM controller 122 of the random access main memory (RAM) 118. The various memory units 114 to 118 respond to instructions of the central processing unit(CPU) 120. The $L_1$ cache 114 is the fastest in its response and the most costly per bit. The response of the $L_2$ cache 116 is not quite as fast as that of the $L_1$ cache and its cost per bit is less. The main RAM 118 is the slowest of the three units and cost the least per bit.

The sizes of the $L_1$, $L_2$ caches and RAM memory are in inverse proportion to their speed. The $L_2$ cache 116 stores a portion of the content of the main RAM 118 while the $L_1$ cache 114 contains a portion of the entries of the $L_2$ cache 116. The disclosed arrangement is part of a personal computer system using an Intel Pentium microprocessor. The microprocessor configuration and attendant requirements for a system using that microprocessor can be found in a manual entitled "Pentium Family Users Manual Volume 1: Data Book" published by the Intel Corporation in 1994. This manual is hereby incorporated by reference.

Figure 2:
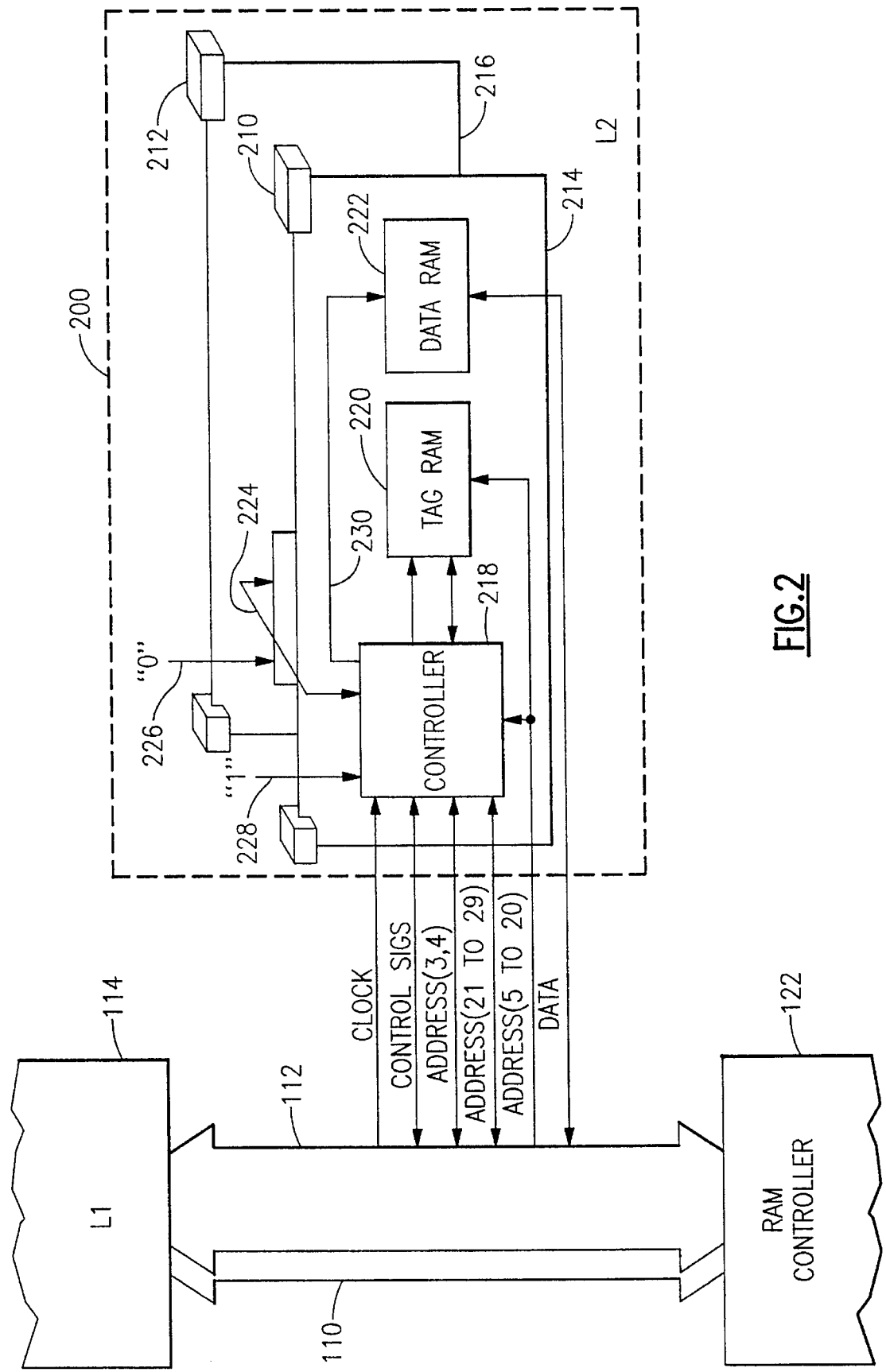
FIG. 2 is a schematic diagram of the $L_2$ cache in FIG. 1.

As shown in FIG. 2, the motherboard 200 for the computer system contains two connectors 210 and 212 for receipt of one or two $L_2$ cache memory cards 214 and 216. The cards 214 and 216 are identical. They each contain three basic components, a controller 218, a tag RAM 220 and a data RAM 222. The data RAM 222 stores system data and instructions. The tag RAM 220 stores address bits and status bits of the information in the storage elements of the data RAM 222. The controller 218 uses information in the tag RAM to determine whether the data requested by the CPU 120 is in the data RAM 222 and if it can be transmitted to the CPU 120.

Figure 3:
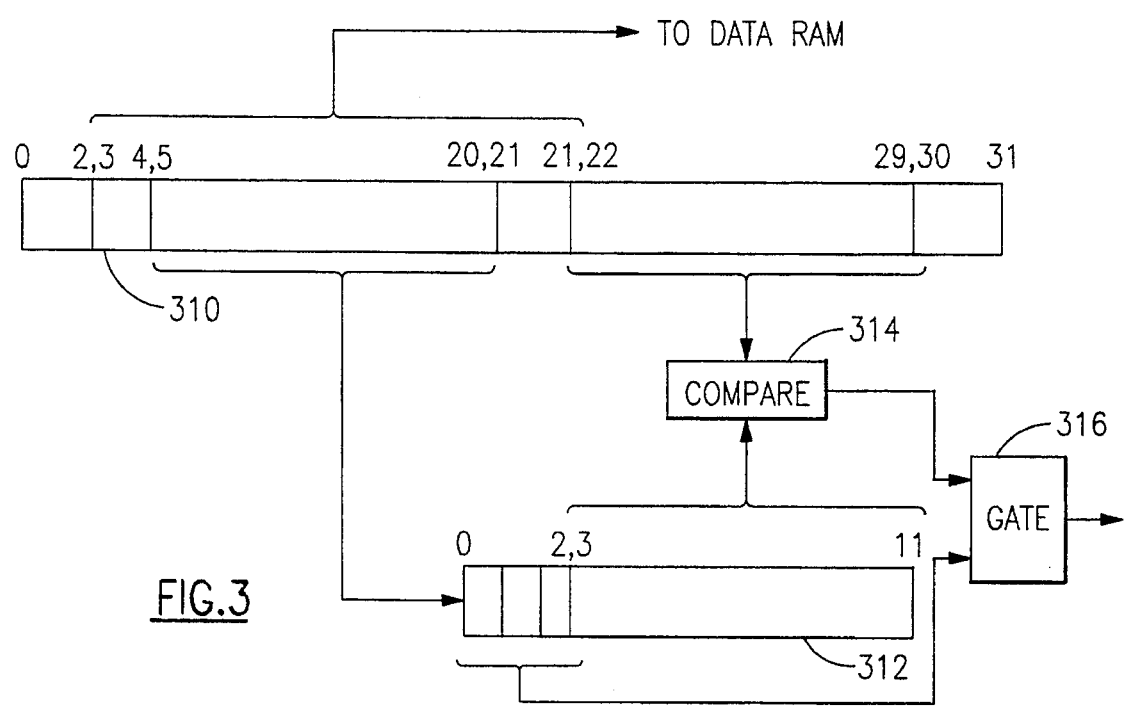
FIG. 3 is a schematic representation of the $L_2$ cache addressing circuitry.

Referring to FIG. 3, of the 32-bit CPU address word 310 received on the address bus 112 of FIG. 2, bits 3 to 29 are pertinent to the normal operation of the $L_2$ cache. Bits 0 to 2 are for a byte address in a word. The $L_2$ cache is addressable only down to the word level so bits 0 to 2 are ignored. Bits 30 and 31 are for addresses above the gigabyte range which do not occur in the present system. Therefore bit 29 is the highest order bit in the normal operation of the system.

Referring to both FIGS. 2 and 3, for an $L_2$ cache with a 2 megabyte data RAM 222, the tag RAM 220 is directly addressed from the buss 112 with bits 5 to 20 of the address 310. This reads a 12 bit word 312 from the tag RAM 220. Each word 312 in the tag RAM 220 includes, in bit positions 3 to 11 of the word, the high order address bits 21 to 29 of data stored in RAM 222 and also includes three status bits in bit positions 0 to 2 of the word 312. A compare circuit 314 in the controller 218 determines if there is a match between the bits 21 to 29 of the stored and requested data by comparing those bits stored in words 312 and 310 respectively. If there is a match, a gate 316 transmits status bits 0 to 2 of the tag RAM word 312 to other circuitry in the controller 218 to determine if the data stored in data RAM 222 is valid. If the requested data resident in the RAM 222 is valid, bits 3 to 20 of the CPU address word 310 are used to access the data RAM 222. Bits 5 to 20 read a 32 byte word out of the data RAM 222 and bits 3 to 4 select the requested 8 bytes out of that 32 byte word.

The address bits and tag bits in a tag RAM word are loaded into the tag RAM 220 from the controller 218 and the address and tag bits stored with the tag RAM are fed back to the controller when they are read out. During normal operation, the contents of the tag RAM 220 are never directly loaded onto the data and address busses 110 and 112 of the system making accurate testing of the controller and Tag RAM very difficult. The proper testing of each is dependent on the proper operation of the other. This interdependency makes fault analysis difficult.

Testing of the tag RAM is also exacerbated by the fact that desired test patterns cannot be used because certain status bit combinations cannot be loaded into the tag RAM through the controller. The reason for this is based on the function of the status bits. They are to determine the accessibility to the data RAM location covered by those bits to a read or write operation by the CPU 120. When status bit 0 is a binary "0" the data RAM address location is read only. When status bit 0 is a binary "1" the data RAM address is writable. When status bits 1 and 2 are "1, 1" the data is modified (M) from the copy of the data in the RAM. When bits 1 and 2 are "0, 1" the data is exclusive (E) and can be modified. When bits 1 and 2 are "1, 0" the data is shared and cannot be modified and when they are "0, 0" the data is invalid. Therefore, certain combinations of the status bits 0 to 2 cannot logically occur during normal operation of the system. For instance, the combination "0, 1, 1" cannot occur because the data cannot be both read only and at the same time changed. As a result, the controller 218 is not designed to accommodate those combinations.

In accordance with the present invention, a control signal combination that would never occur during normal operation of the system is used to modify the caches configuration to permit it to load and unload the cache tag RAM directly. This allows full testing of the tag RAM and loading of any desired test pattern into the tag RAM to test other components of the $L_2$ cache.

Figure 4A:
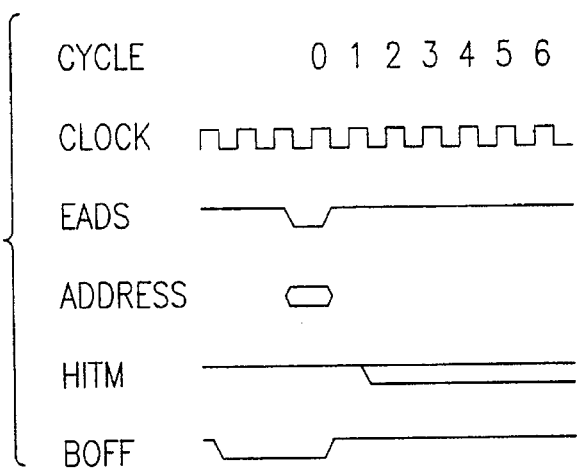
FIGS. 4a, 4b and 4c are signal diagrams of showing the command signals used in a SNOOP cycle, a tag test write cycle and a tag test read cycle respectively.

FIG. 4a shows a SNOOP cycle. In a Pentium based processor system, a SNOOP cycle is a request by the memory controller 122 of the main RAM 118 for a modified copy of data that may be resident in either the $L_1$ or $L_2$ cache. First, the controller 122 issues a BOFF# command. In response to the BOFF# command the processor 120 cancels all pending commands and lets the buses 110 and 112 float. The controller 122 waits two clock cycles for the buses 110 and 112 to quiet down and then issues an EADS# command with the placing of an address on the bus 112. The $L_2$ cache recognizes the initiation of a SNOOP cycle when EADS# command appears. The $L_2$ cache ignores the SNOOP cycle if the address requested by the controller 122 is not in the $L_2$ cache or status bits in the tag RAM 220 are not 1,1,1 indicating the data at that address is modified. If the requested address is in the $L_2$ cache and status bits in the tag memory indicate the data is modified, the $L_2$ cache samples the HitM# line to determine if the $L_1$ cache also has the modified data. If the HitM# line is low indicating the $L_1$ cache has the data, the $L_2$ cache treats the Snoop request as a write through cycle and ignores the request. However, if the HitM# line is high, indicating that the $L_2$ cache alone has a copy of the modified data, the $L_2$ cache will assert a BOFF# command on the 4th clock cycle and provide the requested data on bus 10.

Figure 4B:
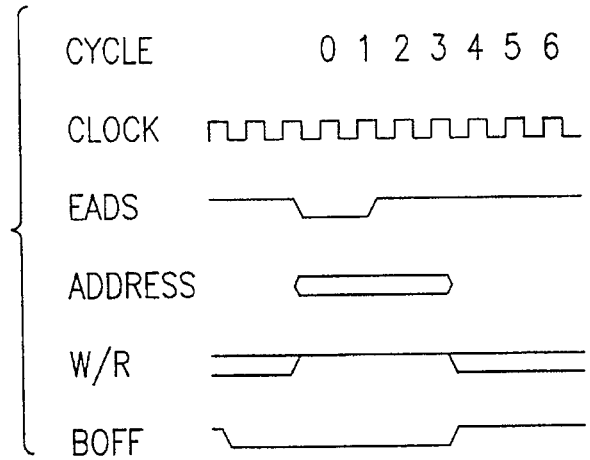
Figure 4C:
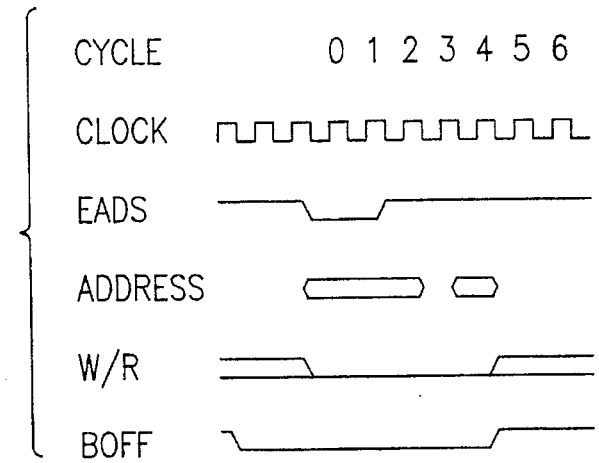
Figure 5:
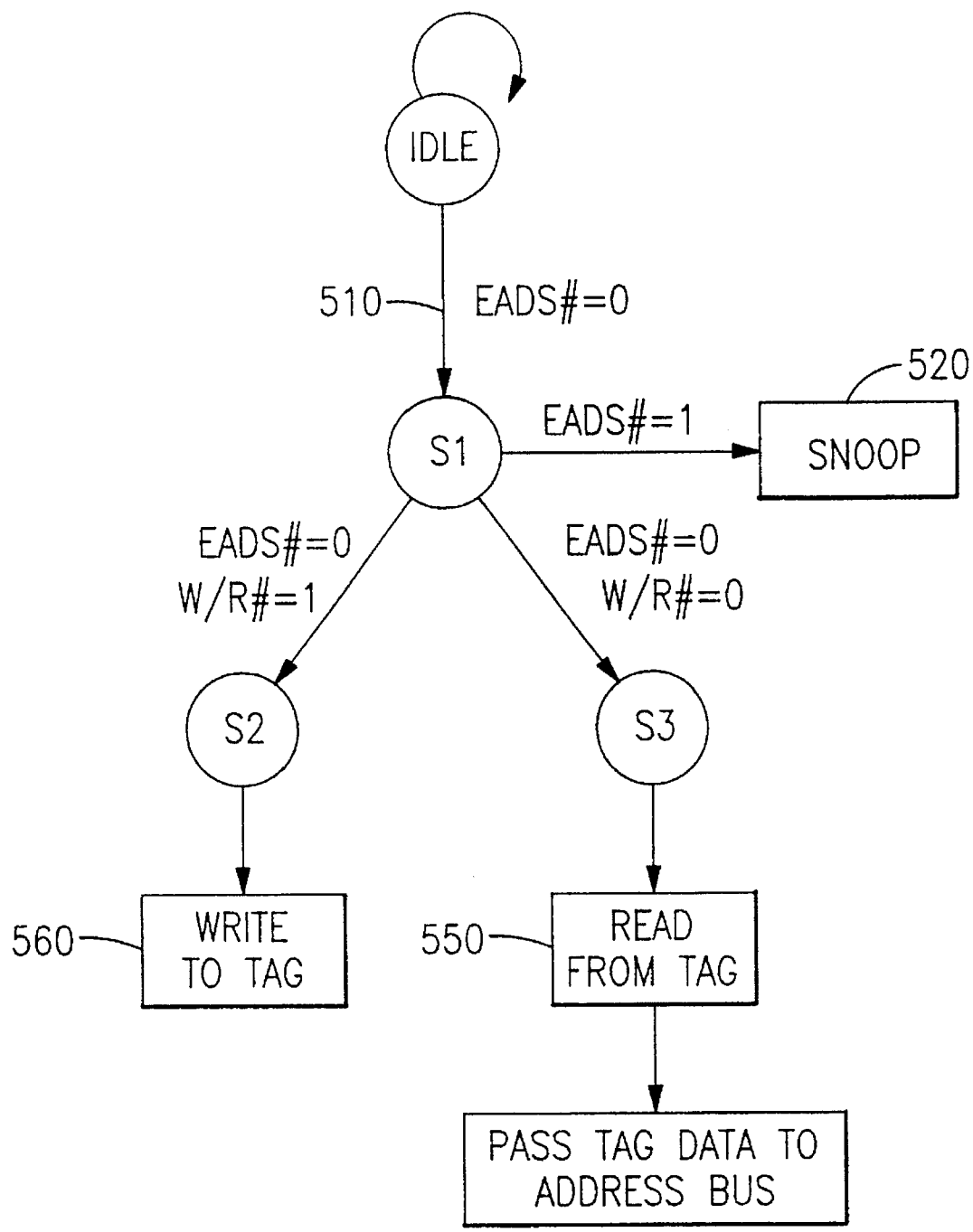
FIG. 5 is a flow diagram indicating the effect the difference of length of the EADS# cycle has on $L_2$ cache response.

To distinguish a tag RAM test from a SNOOP cycle, the length of the EADS# command is modified. As shown in FIGS. 4b and 4c, the EADS# command is twice the length in FIG. 4a for a SNOOP cycle. As shown in FIG. 5, circuitry in the $L_2$ controller recognizes the differences in the length of the EADS# commands in the tag RAM test cycle and the SNOOP cycle. When the EADS# goes low 510 the RAM controller 122 or a tester can be requesting either a SNOOP or a tag RAM test cycle. If the EADS# line rises after one clock cycle, a SNOOP cycle 520 is to be performed. If it remains low for another clock cycle a tag RAM test cycle in the $L_2$ cache has been requested. When information is to be read 550 from the $L_2$ cache the read/write (W/R#) line is down and when information is to be written 560 into the cache, the W/R# line is high.

As shown in FIG. 6, detector 610 receives the EADS#, the system clock (CLK) and the R/W control signals from the cache input latches 600 for the control lines of the system address buss 112. Depending on whether the signal in the R/W input latch is up or down, the detector generates either a positive tag test read (TT/read) or tag test write (TT/write) pulse when the detector determines the EADS# command is two system clock cycles long. At the same time, the SNOOP circuits the $L_2$ cache recognizing the additional length of the EADS# pulse remain disabled. When the EADS# command is only 1 cycle both the TT/read and TT/write pulses remain down and the SNOOP circuits perform a SNOOP cycle.

As shown in FIG. 3, address bit lines 5 to 20 are used to address a word line 312 of the tag RAM. Address bit lines 3 and 21 to 31 of the address buss are not used in tag RAM addressing during normal system operation. However, as shown in FIG. 6 they are used during tag RAM testing to load and unload data from the tag RAM array 660. Address bit lines 21 to 29 are used to carry data to and from the tag bit positions 3 to 11 of the addressed tag RAM line and address bit lines 3, 30 and 31 are used to load and unload data in the status bit positions 0 to 2 of the addressed tag RAM line.

The TT/write and TT/read signals access the address drivers of the tag RAM and also enable gate 640 to allow system address bit lines 3 and 21 to 31 in the address buss 112 to receive from or send information to the data drivers and sense amplifiers 650 of the tag RAM.

Referring to FIGS. 1, 4b and 6, during a tag test write cycle the tester asserts a BOFF# command to initiate the cycle. The tester then waits two cycles and issues an extended EADS# command. The tag test detector 610 recognizes this as a request to perform a tag test while SNOOP circuits 620 in the L$_2$ cache do not recognize this as a valid EADS# command because of the additional length of the command. At the same time the tester provides an address to the tag RAM decoder 630 on bit lines 5 to 20 of the address bus 112. The tag test detector generates a TT/write pulse which gates data bits on bit lines 3 and 21 to 31 of the address buss to the sense amplifier/driver circuits 650 of the tag array. The TT/write signal activates logic circuit 670 to provide chip select output enable and a write signal to the tag array driver circuits 650 to load the data bits into the accessed word line of the tag array 660.

The tag test read cycle differs from the write cycle as shown in FIG. 4c. The BOFF# and EADS# commands are the same as in the write cycle. However, the W/R line is lowered resulting in a TT/read pulse which activates the sense amplifiers of the tag array and gate 640 to transmit the sensed data stored in the word line of the tag array accessed by address bits 5 to 20 onto bits 3 and 21 to 31 of the address buss 112. The data on the address lines is split. The first segment is the address provided on address lines 5 to 20 and the second is the data read from the array that is placed on address lines 3 and 21 to 31. The time between the segments is the logic response time of the circuitry.

While the invention has been described in detail herein in accordance with one embodiment thereof, many modifications and changes may be made by those skilled in the art. Accordingly, it is intended by the appended claims cover all such modifications and changes that fall within the true spirit and scope of the invention.

The invention claimed is:

1. In a computer system cache which has a tag array that stores address and status bits for data stored in a data array of the cache, wherein the states of the status bits are generated in internal control circuitry for the cache, apparatus for accessing the bit positions of the tag array independently of internal control circuitry from an external interface of the cache comprising:
    a) detection circuit means responsive to a modified system access request to generate a testing mode operation signal, wherein the system access request is a request for data stored in said cache with a specific status identified by said status bits in said tag array;
    b) logic means in the control circuitry responsive to said testing mode signal to load addressing bits for the tag array and data bits to be stored in the tag array from the address and control bit interface; and
    c) independent test path means to the tag array responsive to said testing mode operation signal to permit both reading and writing in both address and status bit locations of the tag array.

2. The cache of claim 1 wherein said modified system access request is initiated by a control bit pulse which is longer than the control bit pulse on the same control bit line in the system access request.

3. The cache of claim 2 wherein said detection circuit means is responsive to the difference in length of the control bit pulses to generate said testing mode operation signal only on the occurrence of the longer pulse.

4. The cache of claim 3 wherein said system access request is a command in a SNOOP cycle in which requests for modified copies of data stored in main memory of the computer system are requested by a controller for the main memory.

5. The cache of claim 4 including means insuring disablement of the SNOOP cycle on occurrence of said testing mode operation signal.

6. The cache of claim 1 wherein said independent test path means for both the address bits and the data bits includes address bus locations of the external interface.

7. In a cache of a computer system where the cache contains tag memory that stores status bits for data stored in a data memory of the cache and controller circuitry in the cache prevents direct access to all bit positions in the tag memory, a method of testing the tag memory independently of said controller circuitry comprising:
    a) modifying a system command occurring in a transfer cycle that requests data with a specific status identified by the status bits in the tag memory, which command is normally used by a controller for main memory of the computer system to transfer data in the transfer cycle between the main memory and the data memory of the cache, so that cache controller circuitry does not perform the transfer cycle;
    b) establishing a test path independent of said controller circuitry in the cache to a bus input/output of said system to enable access to all bit positions of the tag memory; and
    c) using other commands used in said transfer cycle to move data into and out of the tag memory in testing said tag memory.

8. The method of claim 7 including the step of making the modified system command longer than the original system command.

9. The method of claim 8 including the step of making the modified system command of step a) a command in a SNOOP cycle in which requests for modified copies in the cache of data stored in main memory of the computer system.

10. In a computer system cache which has a tag array that stores address and status buts for data stored in a data array of the cache, wherein the states of the status bits are generated in internal control circuitry for the cache, apparatus for accessing the bit positions of the tag array independently of internal control circuitry from an external interface of the cache comprising:
    a) detection circuit means responsive to a modified system access request, provided on control signal interface bus locations of the external interface, to generate a testing mode operation signal;
    b) independent test path means to the tag array thru address bus locations of the external interface to address and load data into the log array independent of said internal control circuitry; and
    c) logic means in the control circuitry responsive to said testing mode operation signal to address the tag array and load data bits into the tag array from the address and control bit interface thru the independent test path means.

11. The cache of claim 10 wherein the system access request is a request for data stored in said cache with a specific status identified by said status bits in said tag array.

12. The cache of claim 10 wherein said modified system access request is initiated by a control bit pulse which is longer than the control bit pulse on the same control bit line in the system access request.

13. The cache of claim 12 wherein said detection circuit means is responsive to the difference in length of the control bit pulses to generate said testing mode operation signal only on the occurrence of the longer pulse.

14. The cache of claim 13 wherein said system access request is a command in a SNOOP cycle in which requests for modified copies of data stored in main memory of the computer system are requested by a controller for the main memory.

15. In a cache of a computer system where the cache contains tag memory that stores status bits for data stored in a data memory of the cache and controller circuitry in the cache prevents direct access to all bit positions in the tag memory, a method of testing the tag memory independently of said controller circuitry comprising:

a) modifying a system command used by a controller for main memory of the computer system to transfer data in a transfer cycle between the main memory and the data memory of the cache so that cache controller circuitry does not perform the transfer cycle in response to that system command;

b) establishing a test path independent of said controller circuitry in the cache thru address bus input/output positions of the external interface of said cache to enable access through those address bus input/output positions to address and data locations of the tag memory; and c) using other commands used in said transfer cycle to move data into and out of the tag memory thru the address bus input/output means in testing said tag memory.

16. The method of claim 15 including the step of using as the system command modified in step a) a command normally occurring in a transfer cycle that requests data with a specific status identified by the status bits in the tag memory.

17. The method of claim 16 including the step of making the modified system command longer than the original system command.

18. The method of claim 17 including the step of making the modified system command of step a) a command in a SNOOP cycle in which requests for modified copies in the cycle of data stored in main memory of the computer system.

* * * * *

UNITED STATES PATENT AND TRADEMARK OFFICE
CERTIFICATE OF CORRECTION

PATENT NO. : 5,613,087
DATED : March 18, 1997
INVENTOR(S) : Chin et al.

It is certified that error appears in the above-identified patent and that said Letters Patent is hereby corrected as shown below:

Column 6, line 37,     "buts" should be --bits--
claim 10

Signed and Sealed this

Eleventh Day of November, 1997

*Attest:*

BRUCE LEHMAN

*Attesting Officer*     *Commissioner of Patents and Trademarks*